(12) United States Patent
Matsunaga

(10) Patent No.: US 9,064,979 B2
(45) Date of Patent: Jun. 23, 2015

(54) METHOD FOR MANUFACTURING LED

(75) Inventor: Masafumi Matsunaga, Yokohama (JP)

(73) Assignee: Mtek-smart Corporation, Yokohama-shi, Kanagawa (JP)

( * ) Notice: Subject to any disclaimer, the term of this patent is extended or adjusted under 35 U.S.C. 154(b) by 0 days.

(21) Appl. No.: 14/344,706

(22) PCT Filed: Sep. 4, 2012

(86) PCT No.: PCT/JP2012/072458
§ 371 (c)(1),
(2), (4) Date: Mar. 13, 2014

(87) PCT Pub. No.: WO2013/038953
PCT Pub. Date: Mar. 21, 2013

(65) Prior Publication Data
US 2014/0342480 A1    Nov. 20, 2014

(30) Foreign Application Priority Data

Sep. 14, 2011  (JP) .................................. 2011-200395
Dec. 22, 2011  (JP) .................................. 2011-282421

(51) Int. Cl.
*H01L 21/00* (2006.01)
*H01L 33/00* (2010.01)
*H01L 33/50* (2010.01)

(52) U.S. Cl.
CPC ............ *H01L 33/005* (2013.01); *H01L 33/504* (2013.01); *H01L 2933/0041* (2013.01); *H01L 2924/0002* (2013.01); *H01L 2224/48091* (2013.01); *H01L 2224/8592* (2013.01); *H01L 2933/0025* (2013.01)

(58) Field of Classification Search
None
See application file for complete search history.

(56) References Cited

U.S. PATENT DOCUMENTS

2009/0179213 A1   7/2009  Cannon et al.
2011/0210658 A1*  9/2011  Pan et al. ....................... 313/112

FOREIGN PATENT DOCUMENTS

| JP | 61-161176 A | 7/1986 |
| JP | 2001-126613 A | 5/2001 |
| JP | 2004-363564 A | 12/2004 |
| JP | 2005-152811 A | 6/2005 |
| JP | 2008-130279 A | 6/2008 |
| JP | 2010-003505 A | 1/2010 |
| JP | 2010-119945 A | 6/2010 |
| JP | 2011-037913 A | 2/2011 |
| JP | 2011-089121 A | 5/2011 |
| TW | 201034759 A | 10/2010 |
| WO | WO 2011-083841 A1 | 7/2011 |

OTHER PUBLICATIONS

English translation of International Preliminary Report on Patentability from International Patent Application No. PCT/JP2012/072458, mailed Mar. 27, 2014.

* cited by examiner

Primary Examiner — Scott B Geyer
(74) Attorney, Agent, or Firm — Miles & Stockbridge P.C.

(57) ABSTRACT

A method for manufacturing an LED includes preparing a plurality of different kinds of slurries with a plurality of different kinds of phosphors, a binder, and a solvent, with prescribed weight ratios and viscosities; applying at least one slurry to a substrate LED while vaporizing the solvent instantaneously to form at least one thin layer; transferring the substrate LED to a drying device and drying the substrate LED; forming laminated layers of the plurality of kinds of slurries on the substrate LED; and finally drying and curing the binder to form a dried multilayer coating composed of thin layers of the plurality of kinds of slurries.

19 Claims, 10 Drawing Sheets

METHOD FOR MANUFACTURING LED

TECHNICAL FIELD

The present invention relates to a method and apparatus for manufacturing an LED by applying a coating material to a substrate constituted by an LED or an LED component and to an LED thus manufactured.

More particularly, the present invention relates to a method and apparatus for applying a solution or slurry to a substrate constituted by an LED or an LED component and drying it, and an LED thus manufactured. The present invention further relates to a method and apparatus for manufacturing a white light emitting diode and an LED manufactured thereby. In this specification, the term "LED component" refers to an intermediate product produced in the process of manufacturing a finished LED. The application process in the present invention includes but not limited to continuous or intermittent dispensing, ink-jet, application using micro curtain, application using a slot nozzle, application by atomizing, and spraying.

BACKGROUND ART

In conventional methods of manufacturing LEDs that emit white light, a slurry in which at least one kind of phosphor such as YAG, TAG, or silica-based material and a binder are mixed is dispensed onto an ultraviolet or blue light emitting diode to coat it, a like slurry further containing a solvent added to reduce the viscosity is directly sprayed to the LED using a spray device as a kind of fine particle generating device to coat it, a phosphor plate is prepared to cover the LED, or a phosphor sheet called a remote phosphor is prepared and provided at a location remote from the LED.

Patent Document 1 discloses a method for manufacturing an LED by applying a slurry containing a phosphor to a heated LED chip by spraying while whirling the slurry with compressed air, thereby applying the slurry to a side surface of the LED, which is considered to be difficult to coat by common spraying methods.

Patent Document 2 discloses a process of coating an LED chip with a binder such as silicone and curing it, applying a slurry composed of a phosphor, a binder, and a solvent on it, and laminating a diffuser with them in a mixed manner when necessary.

Patent Document 3 discloses a process of transferring a slurry composed of a phosphor, a binder, and a solvent having a viscosity between 0.1 and 200 cps between two syringes, applying teaching of Japanese Patent Application Laid-Open No. 2004-300000, and applying the slurry to a chip multiple times while whirling the spray stream employing an air pulse spray taught by Japanese Patent Application Laid-Open No. 59-281013

A method using a dispenser as disclosed in Non-Patent Document 1 is widely employed to fill a cup in which a chip is mounted with the slurry for mass production of artillery-shell-shaped LEDs of not high power and LEDs for back light.

It is true that the method disclosed in Patent Document 1 increases chances of arrival of slurry particles to the side surface by whirling of the spray stream. However, to achieve a color temperature of approximately 5000K, it is necessary to provide a coating having a dried slurry weight per unit area of 20 to 100 micrometers in equivalent film thickness, which may vary in relation to the ratio of the phosphor and the binder.

To achieve a color temperature of approximately 2700K, it is necessary to add a red-tinged phosphor and to approximately double the coating thickness, namely to provide a coating having a thickness of 40 to 200 micrometers, and in the case where the slurry is diluted, the wet coating thickness needs to be 1.5 or 2 times thicker. Then, even if heated, a temporal decrease in the viscosity will cause the separation of the coating from the top end face and side surface of the chip, making it impossible to provide a coating having a desired thickness.

In the method disclosed in Patent Document 2, a binder is applied to an LED chip and cured, and then a slurry containing a phosphor is applied thereon by air spraying. However, it is common knowledge among engineers involved in spray coating and in the field of the art that it is impossible to coat a side surface of an LED having corners with sprayed particles at a desired thickness by common air spraying, because the volume of air is 400 to 600 times the volume of sprayed particles and the air arriving at the corners of the LED acts like a cushion to push back ceaselessly-coming air containing particles in a repeated manner.

In the method disclosed in Patent Document 3, while the quality of covering of edges and wall faces tends to be improved by application of coating in multiple thin layers each having a thickness of 3 to 10 micrometers, the chip is heated at low temperature typically in the range of 40° C. to 80° C. in order to prevent unevenness in coating thickness due to bumping of solvent vapor at the moment of spray coating or generation of pin holes, which might be caused if the chip is heated excessively. However, cross linking of a binder such as a silicone is not promoted at high speed at such temperatures. Then, the binder dissolves in the solvent again or swells to cause sinking of the coating at positions near edges and/or flow of coating. Thus, ideal coating cannot be achieved. For this reason, the object to be coated is taken out of the coating apparatus every time at least one layer of coating is applied and dried in a separate drying device for several minutes at a temperature in the range of 150° C. to 200° C. to promote gelation.

Furthermore, a metal masking is placed on the portions of a ceramic substrate or wafer level LED as an object to be coated to which coating should not be applied, in some cases. In such cases, coating on masking plate is removed after applying processing for assisting the removal, and the masking is once detached and attached again in order to prevent curing. In consequence, the time taken by the indirect work including the above-described steps is three to ten times the total coating time, leading to very low productivity.

On the other hand, in the case where a slurry without solvent containing a binder such as silicone and a phosphor is applied through a dispenser using a simple apparatus like one disclosed in Non-Patent Document 1, masking is not needed, and high productivity can be achieved. However, the LED chip is relatively thick or high in the central portion and thin in the edge portion as shown in FIG. 7, and therefore not only the vertical light distribution but also the spatial uniformity distribution thereof is not good. Therefore, this LED chip is not suitable for use as a high power LED for illumination purpose.

PRIOR ART DOCUMENT

Patent Document

Patent Document 1: Japanese Patent Application Laid-Open No. 2005-152811

Patent Document 2: Japanese Patent Application Laid-Open No. 2010-119945
Patent Document 3: TW201034759A1

Non-Patent Document

Non-Patent Document 1: Catalogue of MUSASHI ENGINEERING

SUMMARY OF THE INVENTION

Problem to be Solved by the Invention

To improve durability and color fastness, the materials used as the binder have been shifting nowadays from epoxy-based resins to silicone-base resins, which have poor wettability. There have been developed methods in which a liquid glass produced by sol-gel process is used and coating is eventually cured to enhance heat resistance and color fastness. In the case of the spraying method also, if a thick coating is formed by a wet material, the coating becomes thin in the edge portion on the top face of the chip, as described above, due to sinking of the coating caused by the effect of surface tension and interfacial tension on the surface of the binder and chip surface, resulting in unsatisfactory quality. Moreover, the coating on the side surface suffers from the above-described phenomenon, leading to variation in color temperature in the surrounding space, in particular (namely, poor spatial uniformity). In the industry, many companies are tackling on this problem.

Since wettability of silicone binders on the chip is poor as described above, it is needed to improve the wetting by modifying the silicone binder through corona discharge treatment, plasma discharge treatment, or frame treatment and/or to perform forcible wetting and leveling. However, if a thick coating is formed with a low viscosity slurry having excessively high wettability, sags will occur on the edge and the side surface. Therefore, it is difficult to maintain required coating in these portions.

On the other hand, the above-described problems are not encountered with a multilayer coating that is dried every time coating is applied. However, it suffers from very low productivity because the time taken by operations of detaching/attaching the work and drying the work is much longer than the time taken by coating.

If, for instance, two ceramic substrates each having a size of 100 mm×50 mm that are placed side by side on a table to extend over an area of 100 mm×100 mm are to be coated with five layers by spray coating using a spray nozzle having an effective spray pattern with a diameter of 10 mm at a traverse speed of the spray nozzle of 60 mm/s and a pitch of 10 mm, it is necessary to apply coating over an area extended by 10 mm on all the four sides of the area to be coated, if uniform coating is desired to be achieved. Hence, the size of the coated area is 120 mm×120 mm. If the traverse distance is set to be 200 mm, and the table pitch feeding is set to be 0.3 second, the required coating time per one layer is equal to A+B+C+D +E, where A is equal to 2 seconds×12+0.3 seconds×12, B is time taken to move the spray nozzle from and to the point of origin, C is time taken to detach and attach the substrate, D is time taken to attach and remove the masking, and E is time taken for temporary drying. The point of origin mentioned above refers to the position at which the traverse (movement in the X direction) of the spray nozzle for coating is started. At this position, idle spraying through the nozzle can be performed.

In the above, A is 25.6 seconds, B is 7 seconds, C is 60 to 120 seconds, D is 120 seconds, and E is 180 seconds. The reason why time E needs to be long is that it takes typically two minutes to heat the work or the object to be coated to, for example, 170° C. in the case where a batch type hot air dryer is used.

If, for example, coating is performed three times, temporary drying is performed twice, and then the substantial drying is performed finally, the total time not including the time for the substantial drying amounts to 19.6 minutes. If coating is performed ten times, and temporary drying is performed nine times, the total time amounts to 72.5 minutes, leading to very high cost that is practically unacceptable, though the performance might be improved. Various attempts to improve the productivity are made, which include enlarging the area of table by e.g. 25 times to increase the proportion of the time for spray coating and increasing the number of workers to enable the coating operation and the other operations to be performed independently from each other.

However, the effects of such attempts are limited. In a practical method, coating of the first layer is performed at a pitch of, for example, 10 mm, and the pitches of coating of the second and subsequent layers are offset by appropriate amounts to achieve uniform coating.

In the case where multilayer coating is applied with the thickness of each layer being small and with the pitches of coating being offset appropriately, it is effective that the actual pitch be as small as 0.1 to 3 mm, because the small pitch allows particles to strike the side surface with impact at desired angles. Moreover, performing longitudinal coating application and lateral coating application will lead to an optimized result.

On the other hand, using a table having an enlarged size of, for example, 500 mm×500 mm and setting an increased number of objects to be coated leads to an increase in the processing speed. However, in order to allow an increased number of objects to be coated to be set, it is necessary to enlarge the opening of the door of the coating apparatus for the operator. Furthermore, in order for the operator to set the objects to be coated over a large area on the table with improved precision, it is necessary for the operator to reach into the apparatus through the opening of the door. Therefore, in the case where a slurry containing an organic solvent is used in a stand-alone apparatus, it is necessary to increase the amount of fresh intake air and the amount of exhaust to ensure health and safety of the operator. Even if the operator does not reach into the apparatus, it is necessary that the face velocity at the opening be kept higher than 0.4 m/s for hygienic reasons. Therefore, for example, in the case of the door with an opening having size of 1000 mm×1000 mm, it is necessary to keep an exhaust air flow rate higher than 24 $m^3$/minute, leading to large cost only of the consumption of the make up air in the clean room. Moreover, the air velocity in the coating booth is also high accordingly. Consequently, sprayed particles tend to scatter to deteriorate the coating efficiency greatly, leading to waste of expensive phosphor.

Means for Solving the Problems

The present invention has been made to solve the above-described problems. An object of the present invention is to provide a coating method much better in performance than conventional methods and achieving high productivity, a coating apparatus, and an LED. Another object is to provide a manufacturing method that is excellent in protecting operator's health and safety even if a slurry containing an organic solvent is used and can reduce the production cost greatly, a manufacturing apparatus, and an LED.

The present invention provides a method for manufacturing an LED or an LED component by applying a plurality of different kinds of phosphors to an LED or an LED component to form laminated layers using a plurality of applicators, characterized in that a layer of at least one kind of phosphor among at least two kinds of phosphors is a thin layer whose average thickness after drying is in the range between 3 and 15 micrometers.

In the above-described manufacturing method according to the present invention, it is preferred that said at least two kinds of phosphors in the layers be selected from red, green, and yellow phosphors.

In the above-described manufacturing method according to the present invention, it is preferred that said at least two kinds of phosphors be slurries mixed at least with a binder.

In the above-described manufacturing method according to the present invention, it is preferred that at least one kind of slurry contain a solvent, the weight ratio of the phosphor and the binder in the slurry be in the range between 3:1 and 10:1, the weight ratio of the nonvolatile components and the solvent in the slurry be in the range between 4:1 and 1:4, and the viscosity of the slurry be in the range between 1 and 100 mPa·s.

In the above-described manufacturing method according to the present invention, it is preferred that the method comprises: selecting a combination of two kinds of phosphor slurries for laminated layers from among a combination of red and green phosphor slurries, a combination of green and yellow phosphor slurries, and a combination of red and yellow phosphor slurries; when forming the laminated layers on the LED or the LED component, firstly forming a coating layer made up of one single color layer, single color laminated layers, or laminated layers of two colors, and then applying one or a plurality of kinds of slurries of other color(s) sequentially, each of the layers being a thin layer having an average thickness between 3 and 15 micrometers; performing temporary drying every time one layer or a plurality of layers are applied, and performing drying and curing finally after repetitions of the above steps.

In the above-described manufacturing method according to the present invention, it is preferred that the applicators be devices that atomizing a slurry.

The present invention also provides a coating method for an LED or an LED component. This method is characterized by comprising: atomizing a slurry containing a solvent having a viscosity between 1 and 100 mPa·s in which the weight ratio of the phosphor and the binder is in the range between 3:1 and 10:1, and the weight ratio of the nonvolatile components and the solvent is in the range between 4:1 and 1:4, using an air spray device or air assist spray device; heating the LED or the LED component; setting a distance between the LED or the LED component and an ejection port of the air spray device or the air assist spray device in the range between 5 and 80 mm; setting a width of the spray pattern at the location of arrival at the object to be coated in the range between 1 and 20 mm; and performing spraying while applying impact in a pulsed process.

An LED obtained by the manufacturing method according to the present invention is an LED produced by applying phosphors of at least two colors selected from red, green, and yellow to an LED serving as a substrate to form laminated layers thereon and curing them by drying. The LED is characterized in that the laminated layers are selected from among laminated layers of phosphors of at least red and green, laminated layers of phosphors of at least green and yellow, and laminated layers of phosphors of at least red and yellow, the average thickness of a coating layer of one color among them being in the range between 3 and 15 micrometers.

To solve the above-described problems, according to another aspect of the present invention, there is provided a method for manufacturing an LED or an LED component by applying a coating material to an LED or an LED component, characterized by comprising:

setting the LED or the LED component on a coated object support unit;

then applying at least one kind of coating material to the LED or the LED component to form at least one coating layer in a coating booth using at least one applicator while moving the coated object support unit and the applicator in a relative manner;

then transferring said coated object support unit to a drying device and promoting at least temporary drying of the LED or the LED component or curing of a binder;

then transferring said coated object support unit to the coating booth and applying said at least one kind of coating material to the LED or the LED component to form a layer using said at least one applicator;

then transferring said coated object support unit to the drying device and promoting at least temporary drying or curing;

executing the above steps a predetermined number of times; and then finally drying or curing said LED or LED component.

In the above-described manufacturing method according to said another aspect, a drying device used for final drying or curing may be a drying device other than said drying apparatus used to promote temporary drying or curing of the binder.

In the above-described manufacturing method according to said another aspect, said coated object support unit may be transferred directly to said drying device.

In the above-described manufacturing method according to said another aspect, said coated object support unit may be transferred to said drying device after the LED or the LED component is detached from said coated object support unit, placed in a storage or on a plate, and set on the coated object support unit again.

To solve the above-described problems, in the above-described manufacturing method according to the present invention, it is preferred that said at least one kind of coating material be a slurry containing a phosphor and a binder.

To solve the above-described problems, in the manufacturing method according to said another aspect of the present invention, it is preferred that the number of layers, the number of times of at least temporary drying performed in said drying device, or the number of times of at least processing for promoting curing of the binder contained in a slurry performed in said drying device be selected in the range between 2 and 30.

To solve the above-described problems, in the manufacturing method according to said another aspect of the present invention, it is preferred that the amount of coating applied to the LED or the LED component or the color temperature be measured at least at the time when coating of the second last layer is finished, and if the amount of coating or the color temperature falls out of a predetermined range, coating be performed with a corrected variation amount so that the amount of coating or characteristics fall within the predetermined range.

To solve the above-described problems, in the manufacturing method according to the present invention, it is preferred that said LED comprise a group of LEDs, the coated object support unit be a heating table by which the LED or the LED component is heated to a temperature between 30° C. and 90°

C. at the time of application of a slurry, and the drying device be selected from at least one of a vacuum drying device, hot air drying device, far-infrared drying device, ultraviolet drying device, electrical induction heating drying device, and curing by microwave oven drying device.

To solve the above-described problems, in the manufacturing method according to the present invention, it is preferred that said applicator be a fine particle generating device, a portion of the LED or the LED component that need not be coated be masked, and the fine particle generating device and the LED or the LED component be moved relatively pitch-by-pitch, and the phase of the pitch being varied every time at least one layer is applied.

To solve the above-described problems, in the manufacturing method according to the present invention, it is preferred that said fine particle generating device be an air spray device, the distance between an ejection part at an end of the air spray device and the LED or the group of LEDs be adjustable in the range between 5 and 80 millimeters, the ejection part at the end of the air spray device and the LED or the group of LEDs be moved relatively at a pitch of 2 to 15 millimeters, and the phase be varied by an amount between 0.1 and 7.5 millimeters every time one layer is applied during coating.

To solve the above-described problems, in the manufacturing method according to the present invention, it is preferred that said slurry contain a solvent, and the slurry have a viscosity between 1 and 100 mPa·s.

To solve the above-described problems, in the manufacturing method according to the present invention, it is preferred that the weight ratio of a phosphor and the binder be in the range between 1:3 and 10:1, the weight ratio of nonvolatile components and volatile components be in the range between 4:1 and 1:4.

To solve the above-described problems, in the manufacturing method according to the present invention, it is preferred that at least one kind of slurry be atomized into particles, and the particles be charged with electricity and applied to the LED or the LED component.

To solve the above-described problems, the present invention provides a method for manufacturing an LED or an LED component characterized by comprising: a first step of setting the LED or the LED component on the coated object support unit in a setting/detaching zone outside the coating booth; a second step of transferring the coated object support unit into the booth; a third step of applying a slurry to the LED or the LED component to form at least one layer; a fourth step of transferring the coated object support unit to the drying device outside the booth to promote at least temporary drying or curing; and a fifth step of transferring the coated object support unit into the booth and applying the slurry to form a layer, wherein after repeating the fourth and fifth steps once or multiple times again, the coated object support unit is moved to said setting/detaching zone, the LED or the LED component is detached from the coated object support unit, and the LED or the LED component thus detached is finally dried or cured.

It is preferred that the step of finally drying or curing said LED or LED component detached from said coated object support unit be performed by a drying device other than said drying device used to promote temporary drying or curing in said fourth step.

To solve the above-described problems, the present invention provides an LED to which a slurry containing at least a phosphor and a binder is applied by spraying and dried or cured to change the color of light emitted from the LED, the LED being produced by performing a first step of applying at least one kind of slurry to the LED placed on a table heated to a temperature in the range of 30° C. to 150° C. to form at least one coating layer in a coating booth, a second step of transferring the LED to a drying device and promoting temporary drying or curing, a third step of directly or indirectly measuring the color temperature of the LED or the weight of coating, a fourth step of transferring the LED into said coating booth and applying said at least one kind of slurry to form a laminated layer, and after repeating at least one of the second to fourth steps at least once, transferring the LED to the drying device and performing final drying or curing.

It is preferred that a drying device used for said final drying or curing be different from the drying device used for said promotion of temporary drying or curing in said second step.

To solve the above-described problems, the present invention provides an apparatus for manufacturing an LED or an LED component characterized by performing a first step of setting an LED or an LED component on a coated object support unit in a setting/detaching zone for the LED or the LED component outside a coating booth, a second step of transferring the coated object support unit into the coating booth through a first opening provided between the setting/detaching zone and the coating booth and closing said opening, a third step of applying at least one kind of slurry containing at least a phosphor and a binder to the LED or the LED component to form at least one coating layer using at least one applicator, a fourth step of opening a second opening, transferring the coated object support unit to a drying device outside the booth, closing the second opening, and promoting at least temporary drying or curing, a fifth step of opening the second opening, transferring the coated object support unit to the coating booth, closing the second opening, and applying said at least one kind of slurry to form a laminated layer, and after repeating the fourth and fifth steps once or multiple times again, opening the first opening, and transferring the coated object support unit to said setting/detaching zone.

To solve the above-described problems, the present invention provides an apparatus for manufacturing an LED or an LED component characterized by performing a first step of setting an LED or an LED component on a heated coated object support unit in a setting/detaching zone outside a coating booth having a first door, a second step of transferring the heated coated object support unit into said coating booth through an opening provided between the setting/detaching zone and the coating booth and closing said opening, a third step of relatively moving the coated object support unit and an applicator to apply a coating material containing a solvent to the LED or the LED component to form at least one coating layer, opening said opening, transferring the coated object support unit to the setting/detaching zone, and closing said opening to allow the LED or the LED component to be set/detached, wherein the area of a second door provided for the coating booth for access to the interior of the booth is smaller than area of the first door.

Advantageous Effect of the Invention

As described above, in the LED, the method for manufacturing an LED or an LED component, and the apparatus for manufacturing an LED or an LED component according to the present invention, coating with a coating material and promotion of temporary drying or curing are performed repeatedly. In this way, coating layers can be formed with reliable quality without time loss, and mass production of LEDs or LED components can be achieved.

In a preferred mode of the present invention, it is important to perform air spraying with speed energy in a pulsed process as to both the air and coating material, to apply coating in a thin layer even on the side surface of the LED, and to perform coating and temporary drying repeatedly, although no limitation is placed on the applicator and the drying device.

EMBODIMENTS FOR CARRYING OUT THE INVENTION

In the following, preferred embodiments of the present invention will be described with reference to the drawings. The following embodiments are given only for the illustrative purpose to facilitate the understanding of the invention, and not intended to exclude feasible additions, replacements, modifications made thereto by persons skilled in the art without departing from the technical scope of the present invention.

Figure 1:
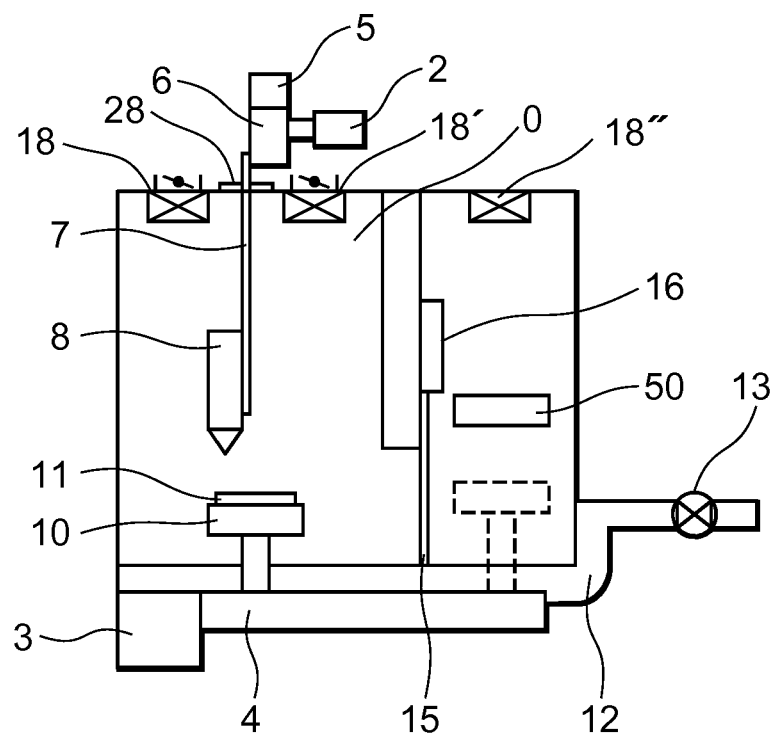
FIG. 1 is a schematic cross sectional view of an application apparatus according to a first embodiment of the present invention, showing mainly an application booth seen from a side.
Figure 2:
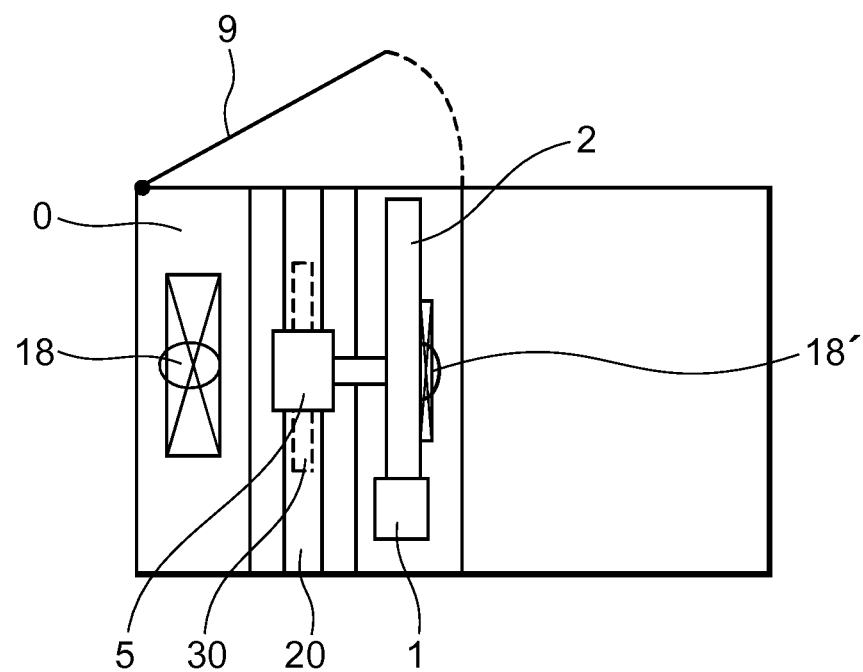
FIG. 2 is a schematic plan view of the application apparatus according to the first embodiment of the present invention.
Figure 3:
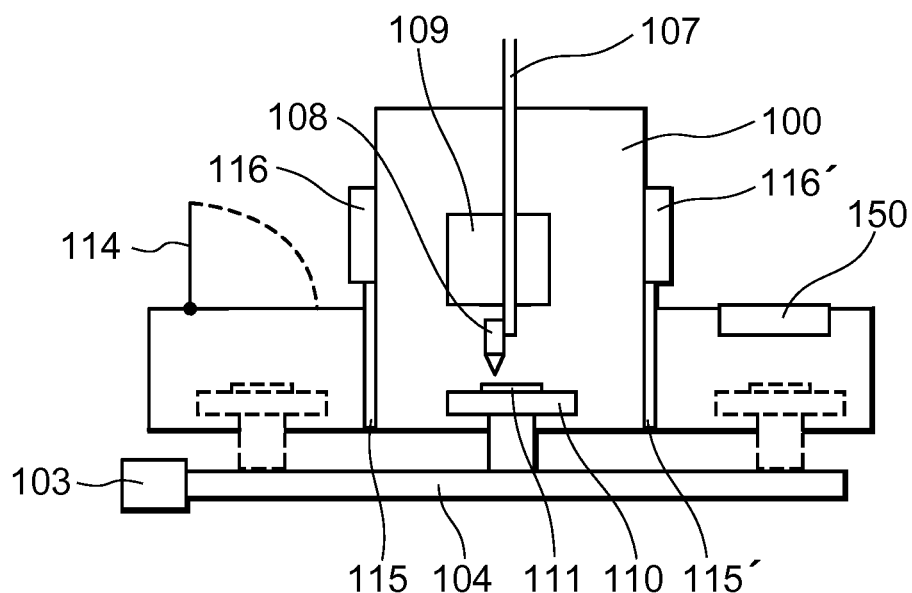
FIG. 3 is a schematic cross sectional view of an application apparatus according to a first modification of the first embodiment of the present invention seen from a side.
Figure 10:
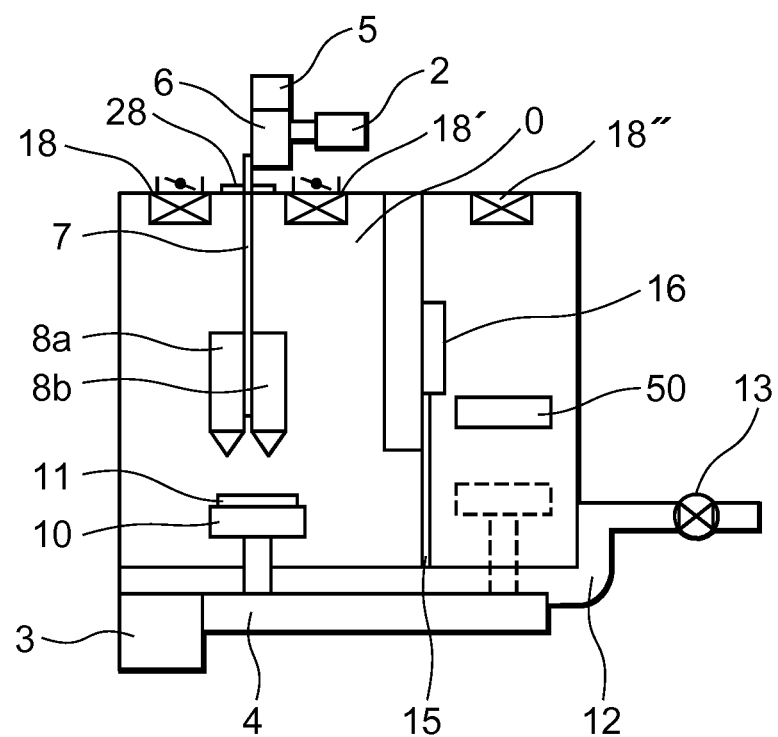
FIG. 10 is a schematic cross sectional view of the coating apparatus according to the first modification of the coating apparatus according to the present invention shown in FIG. 1.

The drawings schematically show preferred embodiments of the present invention.
(First Embodiment)
FIGS. 1 to 3 show a coating apparatus according to a first embodiment of the present invention. FIG. 1 is a schematic cross sectional view of the coating apparatus seen from the booth side, FIG. 2 is a schematic plan view, and FIG. 3 is a schematic cross sectional view seen from a side. FIG. 10 is a cross sectional view of a modification of the coating apparatus shown in FIG. 1 seen from a side.

Referring to FIG. 1, an object to be coated 11, which may be an LED or an LED component, is set on a coated object support unit 10, which is moved by a second drive source 3 and a second drive shaft 4 in a linear direction (Y direction). An applicator 8 is fixed to a bracket 7, which is connected with a third drive source 5 and a third drive shaft 6 to move linearly along the vertical direction (Z direction). Furthermore, the third drive shaft 6 is moved in a linear direction (X direction) by a first drive shaft 2 that is moved in a direction perpendicular to the second drive shaft 4, so that the applicator 8 can move in two perpendicular directions by pitch by pitch. Thus, uniform coating can be achieved over an area of the strokes of the drive shafts.

Conversely to the above-described "lateral application" of coating, coating may be performed by "longitudinal application" in which the applicator is moved on a pitch-by-pitch basis and the coated object support unit is moved continuously. Alternatively, the lateral application and the longitudinal application may be performed alternately. After the coating material is applied to the object to be coated 11 in at least one layer by the applicator 8, the object to be coated is transferred to a drying zone disposed on the right side in FIG. 1, where temporary drying or promotion of curing is performed by a drying device 50 with a shutter 15 of a shutter opening and closing device 16 being closed. The drying means may be selected from heated air, far-infrared light, vacuum, ultraviolet light, and curing by microwave oven. Alternatively two or more of them may be employed in combination. No particular limitation is placed on the drying means.

In the case where the coating apparatus is equipped with two applicators as is the case with the coating apparatus one shown in FIG. 10, it is very effective to drive the two applicators 8a, 8b separately or simultaneously to apply different coating materials respectively. There may be provided, for example, three applicators.

It is preferred that what is exposed in the coating booth 0 include only requisite components such as the applicator 8, the object to be coated 11, and the coated object support unit 10, and that the drive sources and electric wiring that can be a cause of ignition in the case where the coating material contains an organic solvent be not provided in the coating booth 0 for the sake of safety. The present invention readily allows this arrangement.

Air intake units 18, 18' are provided in the upper part of the coating booth, and an air intake unit 18" is provided in the upper part of the drying chamber. The air taken into the booth and the drying chamber through the air intake units 18, 18', 18" is discharged by down draft through a discharge unit 12 provided in the lower part of the booth and a discharge fan 13. As a filter in the intake units, it is preferred that an HEPA be used. Since the applicator generates fine particles, it is preferred that a sintered material having fine porosity allowing air to pass or a fire-resistant aramid fiber be used as a discharge air filter for the purpose of trapping surplus particles in the case where the coating material is, for example, a slurry containing an organic solvent. Activated carbon may be used in place of or in addition to the discharge air filter, for adsorption of the organic solvent and solvent odor. Alternatively, a vacuum type solvent collector may be provided in the discharge line for environmental protection.

To improve the air tightness of the coating booth 0, the upper opening in which the bracket moves and the lower opening allowing the movement of the coated object support unit may be sealed by sealing belts 28 that move with these components. In FIG. 1, only the belt 28 that seals the upper opening is illustrated. The structure of the sealing belt is described in detail in WO2011/083841A1, which discloses an invention made by the inventor of the present invention. Therefore, the structure of the sealing belt will not be described here. The coated object support unit 10 may be a heated table to heat the object to be coated. In addition, the coated object support unit 10 may be designed to have a suction structure that sucks the object to be coated by means of a vacuum pump or the like for the purpose of preventing the object to be coated from being displaced and achieving close contact to facilitate heat transfer. The heating means of the table may apply heat by a circulating heating medium, heating element, electrical induction heating, high-frequency heating or other means. No particular limitation is placed on the heating device or heating method.

If the table on which the object to be coated is placed is a suction table, a masking on the object to be coated can be integrally sucked and fixed by only laminating a film or thin metal plate having an application opening(s) and a heat-resistant and solvent-resistant adhesive applied to a part or entire area of its surface on the side away from the coated side. Thus, the masking system can be made simple.

Since the applicator and the object to be coated on the table move relatively in two perpendicular directions, it is possible to apply coating material effectively with the applicator over the entirety of the object to be coated or only in a desired portion thereof according to a command sent from a separate control unit (not shown). The object to be coated is fed or shifted intermittently in the Y direction at a desired pitch or step by the second drive source 3. The applicator 8 is moved in the X direction by the first drive source 1 while performing application during periods in which the shift in the Y direction by the second drive source is in halt. One layer of coating can be achieved by performing the application and intermittent shift of the object to be coated repeatedly. In the coating of the second and subsequent layers, coating is performed with the pitch position (i.e. the position at which the coating is started) being offset automatically by a program of the separate control apparatus, whereby uniform coating can be achieved. Alternatively, coating may be performed by driving the first drive shaft 2 in operatively associated with the applicator 8 intermittently to move pitch by pitch the applicator 8 in the X direction and moving the coated object support unit 10 in operatively associated with the second drive shaft 4 continuously in the Y direction while the pitch by pitch movement of the applicator 8 is in halt. It is preferred that coating of the second and subsequent layers be performed in the same manner. Alternatively, the above-described modes of coating may be performed alternately. Each drive shaft maybe replaced by a combination of a guide rail and a rope or belt that can be driven by a drive source.

As shown in FIG. 2, the third drive source 5, which is moved by the first drive source 1 and the first drive shaft 2 in upward and downward directions in the exterior above the coating booth 0, or along the linear direction Z, is connected to the third drive shaft 6 shown in FIG. 1. Air is taken into the interior of the booth 0 and the interior of the drying chamber through the air intake units 18, 18', and 18''. Access to the interior of the booth is made through the openable door. The length of the opening 30 shown in FIG. 2 that allows the movement of the applicator 8 in the Y direction may be increased to enable coating over a large area. The opening 30 is sealed by a belt 20 extending in the Y direction, which moves in operatively associated with the first drive shaft 2, to keep air tightness. It is preferred that the first and third drive sources 1, 3 and the first and third drive shafts 2, 4 be provided outside the booth 0 and that the opening 30 for movement etc. be sealed by the belt 20 or the like, for hygienic and safety reasons, though the invention is not limited by this feature.

FIG. 3 shows a first modification of the first embodiment of the present invention. Portions equivalent to those in the coating apparatus shown in FIG. 1 will be denoted by reference numerals equal to those in FIG. 1 plus 100, and the following description will be directed mainly to what is different from what is shown in FIG. 1.

Referring to FIG. 3, an object to be coated 111 is set automatically onto a coated object support unit 110 through an opened door 114 of the coated object setting/detaching chamber provided on the left side of the coating booth 100 or through another opening that is not shown in the drawings. The coated object support unit 110 can move into the coated object setting/detaching zone in a coated object setting/detaching chamber, a coating booth 100, and a drying device 150 provided on the right side of the coating booth 100. For this movement a long drive shaft 104 and a drive source 103 are needed as a driving device. The shaft may be replaced by a belt, which may also serves as a coated object support unit. The booth is provided with a door 109 on the front side, which allows access to the interior of the booth. It is sufficient for the door 109 to only allow adjustments of the applicator etc. and access to a coating material supply unit that is not shown in the drawings. Therefore, the area of the door 109 may be much smaller than the door 114 of the coated object setting/detaching chamber (the area of the door 109 may be e.g. 300 mm×300 mm), even the object to be coated and the coated object support unit have a large area of 500 mm×500 mm, leading to small make up air energy.

Therefore and in order to prevent other areas from being affected adversely, the coated object setting/detaching chamber and the coating booth 100 is partitioned by a shutter 115, which can be opened and closed, and the coating booth 100 and the drying device are partitioned by a shutter 115' of a shutter opening and closing device 116', which can be opened and closed.

Figure 4:
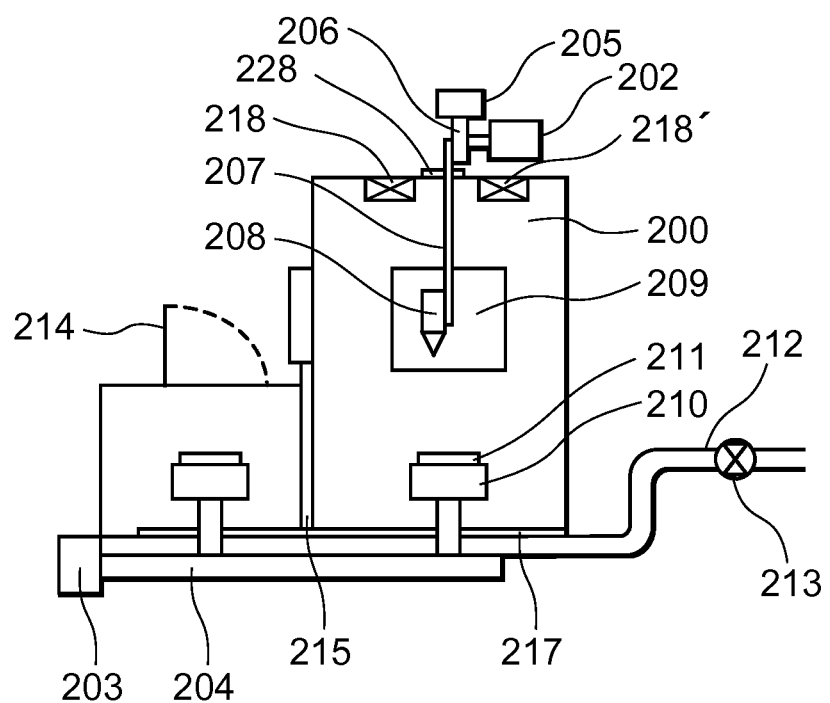
FIG. 4 is a schematic cross sectional view of an application apparatus according to a second modification of the first embodiment of the present invention seen from a side.

FIG. 4 shows a second modification of the first embodiment of the present invention. Portions equivalent to those in the coating apparatus shown in FIG. 1 will be denoted by reference numerals equal to those in FIG. 1 plus 200, and the following description will be directed mainly to what is different between FIG. 1 and FIG. 3.

Referring to FIG. 4, a coating booth 200 and an object to be coated setting/detaching chamber are partitioned by a shutter 215, which can be opened and closed. Thus, the coating booth 200 and the coated object setting/detaching chamber can be partitioned. Therefore, the area of an access door 209 leading to the interior of the coating booth 200 may be much smaller than the door 214 of the coated object setting/detaching chamber. Consequently, if, for example, the coating apparatus is installed and used in a clean room, the quantity of air taken into/discharged from the coating booth 200 can be made small. This is a great advantage in regard to energy and coating efficiency in spray coating, even in the case where the apparatus is not annexed with a drying device.

(Second Embodiment)

Next, a second embodiment of the present invention and its modification will be described with reference to FIGS. 5 and 6.

Figure 5:
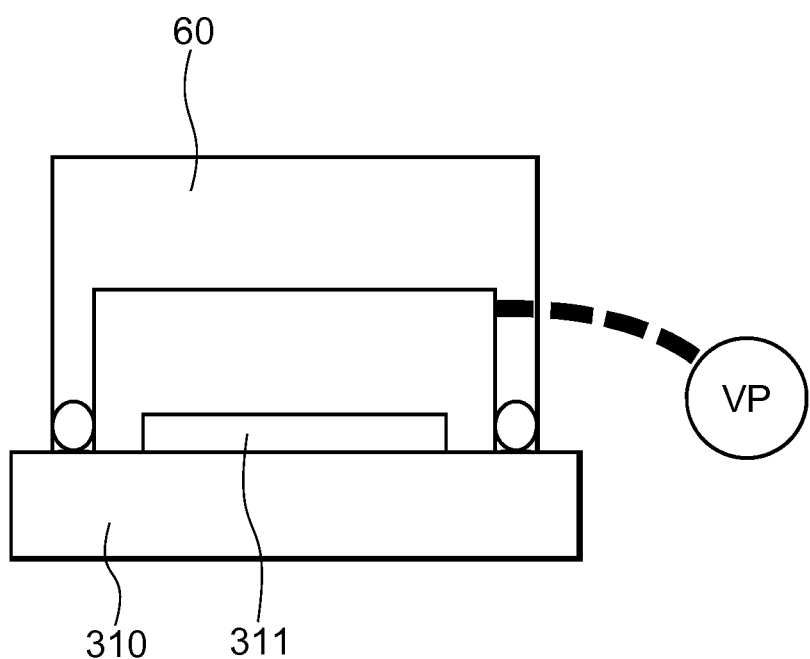
FIG. 5 is a schematic cross sectional view of a drying device according to a second embodiment of the present invention.
Figure 6:
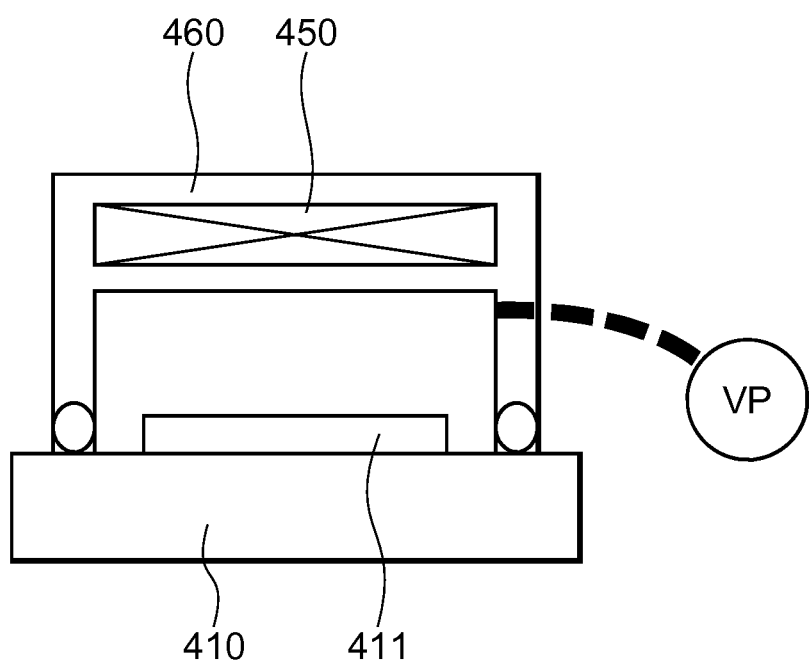
FIG. 6 is a schematic cross sectional view of a coating apparatus according to the second embodiment of the present invention.

In the second embodiment, FIG. 5 is a cross sectional view of a vacuum drying device seen from a side, and FIG. 6 is a cross sectional view of a vacuum drying device additionally provided with a heater unit, seen from a side.

Referring to FIG. 5, an LED 311 as an object to be coated is kept in close contact with a heating table 310 by means of a packing and a vacuum pump is run in a vacuum chamber 60, whereby drying of the coating material applied to the LED 311 is promoted. This is particularly effective in the case where a mild solvent having a high boiling point, because vacuum can lower the boiling point to enable the solvent to evaporate at high rate. In the drying zone, the LED as the object to be coated on the heating table heated to a temperature in the range of 30° C. to 150° C. is brought into close contact with the table by increasing the degree of vacuum by a separately provided vacuum pump. This enables the LED to reach a set temperature in a short time and can cause drying or curing to progress rapidly.

In the case shown in FIG. 6, a far-infrared heater 450 is provided in the upper part of the vacuum chamber 460, so that the object to be coated 411 can be heated in two ways. Therefore, it is sufficient for the heating table 410 to provide heat in the range of 30° C. to 90° C., which is favorable for coating application.

Figure 7:
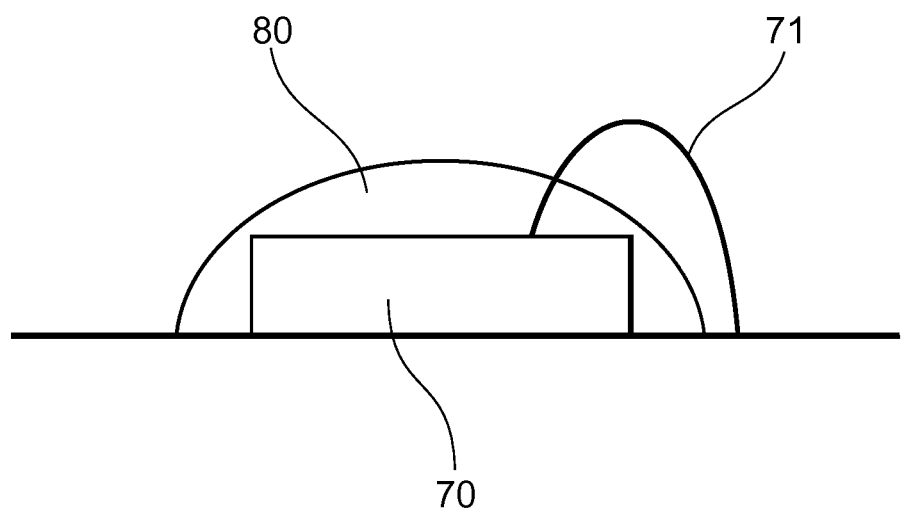
FIG. 7 is a schematic cross sectional view of a typical LED.

FIG. 7 is a schematic diagram showing an object to be coated 70 for an LED to which slurry 80 containing phosphor is applied by a conventional dispenser. The thickness of the coating is large in the central portion and the coating cannot cover the edge, leading to a variation in the color temperature. The portion near a pad to which a lead wire 71 is bonded is shaded and difficult to coat.

EXAMPLE

An example of the present invention will be described with reference to FIG. 8.

Figure 8:
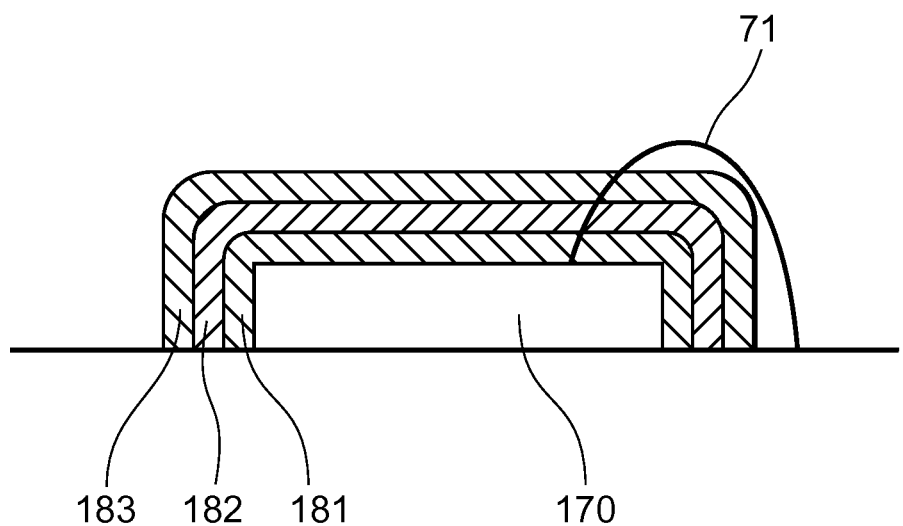
FIG. 8 is a schematic cross sectional view of an LED component according to the first and second embodiments of the present invention.

FIG. 8 shows a first layer 181 formed by applying one or multiple layers of slurry to an LED chip 170 according to the method for the present invention and thereafter promoting curing of the binder in a drying device, a second layer 182 of which curing of the binder has been promoted in the same manner, and a third layer 183 of which curing has been promoted. Applying the present invention enables uniform coating of the surface of the LED chip 170 and coating of the edge and side surface. Since curing of the binder is promoted, the degree of redissolution into the binder by a solvent in the next coating is negligibly low. Thus, high quality coating can be achieved. In FIG. 8, what is denoted by reference numeral 71 is a lead wire.

Specifically, it is highly difficult for conventional techniques to apply a slurry composed of a phosphor having a high specific gravity and an average particle size distribution at about 10 microns between several microns and 30 microns, a binder having a relatively low specific gravity, and a solvent added when needed, to form a thin layer with a variation per unit area of ±1.5% by one coating process. Furthermore, in a microscopic view, some portions thereof may contain large particles, and other portions thereof may contain small particles, as a matter of course.

In the present invention, coating is applied in a maximum number of thin layers by discharging a uniformly dispersed slurry, which is prepared by: arranging a syringe filled with a slurry, an applicator, and a small-size pump in a circulating path and causing the slurry to circulate while agitating the slurry in the syringe if needed to achieve uniform dispersion; providing a agitating and pumping system in a circulating path including a syringe filled with a slurry to cause a pressurized flow to pass through an applicator and return to the upstream of the syringe; or causing a slurry to move alternately between two syringes with a pressure difference, a jet flow being generated in the slurry moving to one of the syringes by a fluid pressure difference of 15 KPa to 40 Kpa and an increased flow speed resulting from a flow passage diameter of 0.5 mm to 1 mm in at least a portion of the flow passage.

By the above method, it is possible to make the particle size distribution of the coating film uniform, as a matter of probability. Moreover, a vibration may be applied to a preferred portion of the circulating path, whereby further improved dispersion can be maintained. In a more preferred coating, the surface of the LED may be configured to have electrical conductivity, as is the case in electrophoresis. Then, for example in the case of spray coating, atomized particles can be charged with static electricity to prevent aggregation of atomized particles and to enable adhesion of fine particles. Thus, an ideal phosphor coating can be achieved.

The present invention is not limited to coating with one kind of slurry in a plurality of laminated layers by a single applicator, but multiple kinds of phosphors may be applied in a plurality of layers by a plurality of applicators. Specifically, according to the present invention, an LED may be manufactured by applying a plurality of phosphors different in kind to an LED or an LED component as an object to be coated in laminated layers and drying them, using a coating apparatus having a plurality of applicators, e.g. two applicators 8a, 8b as shown in FIG. 10, provided in one coating booth, and it is preferred that the average thickness of at least one thin layer of phosphor among the two kinds of phosphors laminated in layers be in the range of 3 to 15 micrometers.

The aforementioned at least two kinds of phosphors that form layers may be selected from red, green, and yellow phosphors.

It is also preferred that the aforementioned at least two kinds of phosphors be mixed with a binder to form a slurry.

Furthermore, it is preferred that at least one kind of slurry contain a solvent, the weight ratio of the phosphor and the binder in the slurry be in the range between 3:1 and 10:1, the weight ratio of the nonvolatile components and the solvent in the slurry be in the range between 4:1 and 1:4, and the viscosity of the slurry be in the range between 1 and 100 mPa·s.

It is also preferred that a combination of two kinds of phosphor slurries for laminated layers be selected from among a combination of red and green phosphor slurries, a combination of green and yellow phosphor slurries, and a combination of red and yellow phosphor slurries, when forming laminated layers on an LED or an LED component, a coating layer made up of one single color layer, single color laminated layers, or laminated layers of two colors be firstly applied and one or a plurality of kinds of slurries of other color (s) be applied sequentially with each of the layers being a thin layer having an average thickness between 3 to 15 micrometers, temporary drying be performed every time one layer or a plurality of layers are applied, and curing by drying be performed finally after repetitions of the above process.

Figure 9:
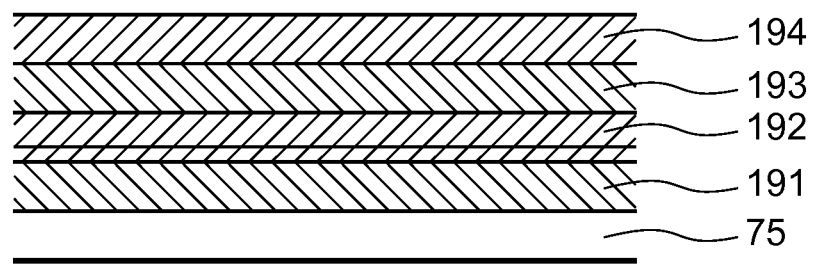
FIG. 9 is a schematic cross sectional view of an LED according to the first and second embodiments of the present invention.

FIG. 9 is a schematic diagram showing a substrate 75 made of a heat resistant PET or PEN film or the like on which slurries have been applied and dried by the method and apparatus according to the present invention for the purpose of making a phosphor film or phosphor plate for covering an LED or making a remote phosphor arranged at a location remote spaced apart from the surface of an LED. In FIG. 9, reference numerals 191 to 194 denote a first layer, a second layer, a third layer, and a fourth layer, respectively.

In this method, slurry is uniformly dispersed as is the case in the above-described application to an LED substrate. The substrate as an object to be coated may be an electrically conductive material such as a mirror-finish metal plate, or a release coated film or electrically conductive film. Desired slurries are applied in layers onto the substrate as such by spray coating or other means, and thereafter the substrate is separated from the applied and dried phosphor coating. An LED illumination device can be effectively produced by covering an LED with the separated phosphor film or phosphor plate. In this method according to the present invention, the way of charging particles is more effective because the coating is applied on a flat surface, and phosphors of multiple colors can be applied to one coated substrate with ideal distributions using a plurality of applicators as shown in FIG. 10.

For example, in a prior art in which a phosphor is applied to the surface of a ceramic substrate for high power illumination or a wafer level LED chip, a dispenser frequently used with other types of LEDs is used. When a slurry in which a silicone or other binder and a phosphor are mixed is applied, the thickness of the coating on the surface of the LED chip having a size of, for example, 1 mm square becomes large near the center of dispensing due to surface tension and interfacial tension and decreases toward the edge due to sinking. Therefore, it is impossible to form a uniform coating. Moreover, since the height of the chip is approximately 0.1 mm, the edge portion is too thin, and adhesion of coating to the side surface of the chip is very unstable, resulting in unduly large variation in the color temperature, which makes quality of the LED unacceptable as a high power LED for illumination.

As a countermeasure, US2009/1179213A1 discloses a technique in which a binder is applied to a chip, and a slurry made up of a binder, a phosphor, and a solvent is applied onto the binder layer by air spraying, and such coating is applied in a plurality of layers if needed. As described above, an LED chip has a three dimensional structure, and a wire is provided around it. Therefore, to make the coating thickness on the top surface of the chip uniform, it is important to prepare a slurry in which the proportion of the phosphor in weight ratio is made larger than the binder as much as possible by a method using a fine particle generating device such as air spraying and which is diluted by a solvent to have a flow ability, to make the thickness of each layer as small as possible, and to make the number of applied layers as much as possible. Even if spraying is employed, it is impossible to form a relatively thin coating unless the slurry is diluted by a solvent. The dried and thin coating thickness of one layer converted from coating weight per unit area is about 3 to 15 micrometers.

Even in the case where a plurality of thin coating layers are formed using a slurry containing a solvent, if the slurry is applied onto a coating layer that contains residual solvent or has not started to be cured, the binder will be dissolved by the solvent or swell. Then, the quality of coating is similar to coating applied in a thick layer. In view of this, in the present invention, it is important that the object to be coated be heated to vaporize the solvent instantaneously. However, if the thickness of coating is large, the solvent will not evaporate instantaneously even if heated, and it is difficult to form uniform coating due to surface tension, interfacial tension, and sinking increasing toward the edge. Nevertheless, heating the object to be coated to a high temperature between 90° C. and 150° C. will cause the binder contained in sprayed particles to cure before it flows on the chip surface. Then, the surface of the coating might become unsmooth due to bumping, bubbles, and/or unstable gelling, leading to defects in quality.

According to the present invention, it is preferred that the temperature of the heated object to be coated be in the range of 35° C. to 90° C., and it is ideal that it be in the range of 50° C. to 70° C., although the preferred temperature and ideal temperature vary among different kinds of solvents.

In the case where coating is performed by atomizing the coating material by spraying or other method, the surface of the LED chip is cooled rapidly due to heat of vaporization of solvent. Therefore, heating with a heat quantity of 1.5 W to 4.5 W per square centimeter is needed to prevent lowering of the temperature and to improve following capability of temperature rising. It is preferred, from a productivity standpoint, that the table size be in the range of 225 to 2500 square centimeters to allow a plurality of ceramic substrates or wafers to be placed on the coated object support table. It is necessary to mask the areas to which coating must not be applied, such as areas in which soldered connection will be made later.

In the case where a mask is to be reused, the mask may be covered with a fluorine-based or ceramic based processing agent for pollution control, which is usually applied to siding boards for buildings. This facilitates separation of gelatinized coating film on the mask. For high speed production, it is preferred that the object to be coated be laminated beforehand partly or in its entirety with a heat-resistant and solvent-resistant plastic film represented by a fluorine-based resin or polyamide-imide resin using a heat-resistant and solvent-resistant adhesive such as a silicone based adhesive or cross-linking acrylic-based or urethane-based adhesive.

An object to be coated such as a ceramic substrate or wafer is placed on a heated table in coated object placement chamber constituting a coated object placement zone and advanced in the Y direction to a coating booth constituting a coating zone by the second drive source and the second drive shaft, and then starts to be shifted intermittently on a pitch-by-pitch basis at a location before an applicator, which is caused to traverse in the X direction perpendicular to the direction of movement (Y direction) of the object to be coated by the first drive source and the first drive shaft. While the applicator performs application while moving in one direction (X direction) by a required distance in a stroke, the coated object support table is in halt. After the one stroke of coating is completed, or the movement of one stroke is completed, the table is shifted intermittently by one pitch. One layer of coating is formed by performing the above-described operation repeatedly.

In the case where the applicator is adapted for air spraying or air-assist spraying, it is preferred that a spray nozzle having a spray angle that makes the pattern width on the object to be coated or the width of the sprayed coating material on the surface of the object to be coated equal to 1 to 20 mm be used. The pattern width ought to be selected taking into account the desired coating thicknesses in respective portions of the overall chip that depend on the shape and type of the chip. Although continuous spraying may be employed, it is more effective to employ pulsed air spraying disclosed in the PCT application PCT/JP2011/050168 (International Publication WO2011/083841A1) assigned to the assignee of this patent application, in order to achieve desired coating thicknesses on the edge and side surface of the LED chip to employ.

It is preferred that a device used to atomize a slurry as a coating material be air spray device or air assist spray device, a substrate for an LED or an LED component is heated, the distance between the LED or the LED component as the object to be coated and the ejection port of the spray device be set in the range from 5 to 80 mm, the width of the spray pattern at the location of arrival at the object to be coated be in the range of 1 to 20 mm, and spraying be performed while applying impact to the substrate with pulse.

In the case where a slurry containing a binder with low wettability such as a silicone binder is used, it is difficult to cover the side surface and the portion around the edge, unless impact is applied to the coating material to cause it to strike the surface of the object to be coated for LED. Furthermore, if the nozzle diameter is set small or the opening of a needle valve or the like is set small to make the flow rate low with the intention to form a thin coating film, they may be clogged due to properties of the slurry, leading to unreliable coating quality. The spraying with impact pulses according to the present invention is effective in this respect also. The spraying with impact pulses can be brought about by setting the distance between the end of the nozzle and the object to be coated shorter than 80 mm and setting the pressure of the spray air to 0.15 to 0.35 Mpa. In the case where spraying is performed from a very close distance of 5 to 30 mm, the impact can be excessively strong. Therefore, it is preferred that the spray air is set in the range between 0.05 and 0.15 MPa.

It is preferred that the pitch of intermittent shift be in the range of 1 to 15 mm. In the case where the average dry coating thickness of one layer is approximately 7 micrometers in equivalent weight per unit area or smaller, it is preferred, from a productivity standpoint, that coating be performed multiple times in the coating booth, and thereafter the object to be coated be transferred to the drying zone for drying.

While coating is in halt, sedimentation of phosphor particles etc. in a slurry with low viscosity progress greatly, the slurry ought to be moved or caused to circulate to prevent sedimentation. Since the sedimentation can occur even inside the nozzle, the applicator be moved to a home position or the like, and the slurry in the channel downstream of an open/close valve, in which the slurry will not move, be discharged to a small container or the like by idle spraying at predetermined intervals. Idle spraying may be performed in a pulsed manner, which exerts a vibration, leading to small discharge.

It is preferred that the temperature in the drying chamber be set in the range between 90° C. to 250° C., which may vary depending on the type of the binder. It is important from a productivity standpoint to select a device with which drying and curing can be achieved in a short time. The means for drying may be, but not limited to, hot air, far-infrared light, high frequency waves, electrical induction heating, UV, curing using microwaves or other means.

Irrespective of the timing of drying in relation to the number of layers finished, it is ideal that the position at which coating of the second layer is started be automatically offset by a desired distance from the position at which the coating of the first layer is started. In the case where ten coating layers are to be formed with a pitch of 12 mm, setting the offset to 1.2 mm provides the same result in the tenth layer as that in the case of coating performed with a shift pitch of 1.2 mm. However, multilayer coating performed with a large pitch is advantageous over coating performed with a small pitch, because multilayer coating performed with a large pitch can lead to a reduction in the weight of coating per unit area of one layer, eliminating the aforementioned problem of sags. It is preferred that the amount of offset be calculated by dividing the pitch by the number of layers. The amount of offset is typically set in the range between 0.1 to 5 mm. While it is preferred that the number of times of coating, or the number of times of layers, be as large as possible, the number of times of coating has limits when the productivity and the average size of the phosphor particles (having a particle size distribution centered at 3 to 30 micrometers) are taken into consideration. Taking into consideration the quality and productivity, it is preferred that the number of times of coating (or the number of layers) be selected in the range from 2 to 30.

When applying phosphors to an LED or an LED component as an object to be coated, color rendition can be improved by, for example, applying a yellow first layer, a red second layer with a weight of, for example, ⅕ times the weight of the first layer, a yellow third layer, a red or green fourth layer in a laminating manner using a plurality of applicators without mixing yellow, red, and green phosphors having different average particle size distributions and different specific gravities. In this case, the larger the number of laminated layers, the better the dispersion (color mixture) is.

The method according to the present invention can provide an LED as an object to be coated on which at least two of red, green, and yellow phosphors are applied in layers and cured by drying with the average thickness of one phosphor coating layer being in the range between 3 and 15 micrometers.

If the phosphor material on the aforementioned mask is to be recovered, it is possible to recover it efficiently by setting a special mask on a chip on which a binder is applied, applying a slurry containing a solvent and phosphor particles encapsulated by binder, and thereafter removing the coating on the mask.

This method is particularly effective for red and green phosphors, which are expensive. In cases where these colors are to be mixed, coating may be performed in the above-described manner after applying a slurry containing a yellow phosphor and a binder. The reuse of slurry coating containing mixed binder and phosphor on the mask can lead to unreliable quality and may be employed only for middle or low class chips, normally.

Measurement of the color temperature and/or weight may be performed for each layer without reference to whether the number of colors is one or more than one, for a layer(s) for which the measurement is required, or for the second last layer, and the quantity of coating may be corrected when necessary. With this method, the desired quality can be achieved. The object to be coated on which coating has been applied a desired number of times is transferred to a takeout zone and brought into a high temperature dryer or the like manually or automatically for complete cure.

[Industrial Applicability]

According to the present invention, it is possible to manufacture value-added LEDs and LED components with reduced time loss while keeping high quality. The present invention can provide an apparatus that is safe and hygienic even when an organic solvent is used and can be operated with small burden on the operator.

The invention claimed is:

1. A method for manufacturing an LED, characterized by comprising:
    a first step of preparing a plurality of different kinds of slurries with a plurality of different kinds of phosphors, a binder, and a solvent, the weight ratio of said phosphors and said binder being in the range between 1:3 and 10:1, the weight ratio of non-volatile components and said solvent being in the range between 4:1 and 1:4, and the viscosities of said plurality of kinds of slurries being in the range between 1 and 100 mPa·s;
    a second step of applying at least one kind of slurry to a substrate LED placed on a table heated to a temperature between 30° C. and 150° C. while vaporizing the solvent instantaneously to form at least one thin layer by relatively moving the substrate LED and a plurality of applicators in a coating booth while causing said plurality of kinds of slurries to move or circulate in the respective corresponding applicators to prevent said phosphors from sedimenting;
    a third step of transferring said substrate LED to a drying device and drying it every time one or a plurality of layers are formed to promote curing of the binder;
    a fourth step of forming laminated layers of the plurality of kinds of slurries on the substrate LED to which the processing of the third step has been applied, by said plurality of applicators; and
    a fifth step of finally drying and curing the binder to form a dried multilayer coating composed of thin layers of said plurality of kinds of slurries on a surface and a side surface of the substrate LED, the average layer thickness of at least one kind of slurry after drying being in the range between 3 and 15 micrometers in equivalent weight.

2. A method for manufacturing an LED according to claim 1, characterized in that said plurality of different kinds of phosphors are different in color, average particle diameter, and specific gravity, the slurries are caused to circulate by a pump circulation device or caused to move between two syringes with a pressure difference between 15 and 40 kPa while creating a jet flow to prevent the phosphors from sedimenting, at least the substrate LED is shifted intermittently by a pitch of 1 to 15 mm, the applicators are air spray devices or air assist spray devices, the substrate LED is a ceramic substrate LED or a wafer level LED, the distance between the substrate LED and ejection ports of the air spray devices or the air assist spray devices are set to be in the range between 5 and 80 mm, spray pattern widths of said plurality of kinds of slurries at the location of arrival at the substrate LED are in the range between 1 and 20 mm, the spray air pressure is adjusted in the range between 0.015 and 0.35 Mpa, spraying is performed in such a way that the side surface of the substrate LED is also covered, while applying impact with pulse, thereby forming the thin layers while vaporizing the solvent instantaneously, and offsetting of 0.1 to 5 mm is performed every time a layer is formed to achieve a uniform phosphor distribution.

3. A method for manufacturing an LED according to claim 2, characterized in that said binder is a silicone, the laminated layers of said at least plurality of kinds of slurries are selected from a group consisting of slurries of red, green, and yellow phosphors, the average layer thickness of the red phosphor slurry layer is equal to or smaller than one fifth of the sum of the thicknesses of the other phosphor slurry layers, and while application of one slurry is in halt, the slurry in a portion in the applicator downstream of open/close valve in which the slurry does not circulate or move is discharged by idle spraying performed at predetermined intervals while applying vibration with pulse to prevent sediment.

4. A method for manufacturing an LED according to claim 3, characterized in that:
in said first step, a combination of two kinds of phosphor slurries for laminated layers are selected from among a combination of red and green phosphor slurries, a combination of green and yellow phosphor slurries, and a combination of red and yellow phosphor slurries;
in said second step, when forming said at least one thin layer on said object to be coated, a coating layer made up of one single color layer, single color laminated layers, or laminated layers of two colors are formed firstly, and then one or a plurality of kinds of slurries of other color(s) are applied sequentially, each of the layers being a thin layer having an average thickness between 3 and 15 micrometers;
then in said third step, temporary drying for curing the binder of said slurries is performed every time one layer or a plurality of layers are applied; and
after repeating the processing of said first to third steps, said binder is dried and cured finally in said fourth step.

5. A method for manufacturing an LED according to claim 3, characterized in that said drying device and said heated table are connected, an object to be coated on the heated table on which the slurry/slurries has/have been applied in the coating booth is transferred to the drying device by opening an open/close plate provided between the drying device and the coating booth, while being kept heated, whereby time taken to promote curing is shortened.

6. A method for manufacturing an LED according to claim 3, characterized in that:
said substrate LED is a ceramic substrate LED or a wafer level LED, and said slurry contains a silicone, or a silicone and a yellow phosphor;
said second step comprises a setting step of setting a mask with which only a portion that needs to be coated is exposed on said ceramic substrate LED or wafer level LED for application of a thin coating of said slurry made of a silicone or a silicone and a yellow phosphor, a dispersion liquid preparation step of preparing a dispersion liquid containing a phosphor and a solvent or of particulates of encapsulated phosphor and binder and a solvent, a dispersion liquid application step of selecting a dispersion liquid containing a red or green phosphor and applying it to form one or plurality of coating layers, a mask detaching step of detaching the mask to allow recovery of nonvolatile components of the dispersion liquid, and a lamination process of applying a slurry in another applicator to said coating layer of said object to be coated from which said mask has been detached immediately or after promoting curing of said silicone by a drying device to form a laminated layer.

7. A method for manufacturing an LED according to claim 2, characterized in that:
in said first step, a combination of two kinds of phosphor slurries for laminated layers are selected from among a combination of red and green phosphor slurries, a combination of green and yellow phosphor slurries, and a combination of red and yellow phosphor slurries;
in said second step, when forming said at least one thin layer on said object to be coated, a coating layer made up of one single color layer, single color laminated layers, or laminated layers of two colors are formed firstly, and then one or a plurality of kinds of slurries of other color(s) are applied sequentially, each of the layers being a thin layer having an average thickness between 3 and 15 micrometers;
then in said third step, temporary drying for curing the binder of said slurries is performed every time one layer or a plurality of layers are applied; and
after repeating the processing of said first to third steps, said binder is dried and cured finally in said fourth step.

8. A method for manufacturing an LED according to claim 2, characterized in that said drying device and said heated table are connected, an object to be coated on the heated table on which the slurry/slurries has/have been applied in the coating booth is transferred to the drying device by opening an open/close plate provided between the drying device and the coating booth, while being kept heated, whereby time taken to promote curing is shortened.

9. A method for manufacturing an LED according to claim 2, characterized in that:
said substrate LED is a ceramic substrate LED or a wafer level LED, and said slurry contains a silicone, or a silicone and a yellow phosphor;
said second step comprises a setting step of setting a mask with which only a portion that needs to be coated is exposed on said ceramic substrate LED or wafer level LED for application of a thin coating of said slurry made of a silicone or a silicone and a yellow phosphor, a dispersion liquid preparation step of preparing a dispersion liquid containing a phosphor and a solvent or of particulates of encapsulated phosphor and binder and a solvent, a dispersion liquid application step of selecting a dispersion liquid containing a red or green phosphor and applying it to form one or plurality of coating layers, a mask detaching step of detaching the mask to allow recovery of nonvolatile components of the dispersion liquid, and a lamination process of applying a slurry in another applicator to said coating layer of said object to be coated from which said mask has been detached immediately or after promoting curing of said silicone by a drying device to form a laminated layer.

10. A method for manufacturing an LED according to claim 1, characterized in that said binder binder is a silicone, the laminated layers of said at least plurality of kinds of slurries are selected from a group consisting of slurries of red, green, and yellow phosphors, the average layer thickness of the red phosphor slurry layer is equal to or smaller than one fifth of the sum of the thicknesses of the other phosphor slurry layers, and while application of one slurry is in halt, the slurry in a portion in the applicator downstream of open/close valve in which the slurry does not circulate or move is discharged by idle spraying performed at predetermined intervals while applying vibration with pulse to prevent sediment.

11. A method for manufacturing an LED according to claim 10, characterized in that:
in said first step, a combination of two kinds of phosphor slurries for laminated layers are selected from among a combination of red and green phosphor slurries, a combination of green and yellow phosphor slurries, and a combination of red and yellow phosphor slurries;
in said second step, when forming said at least one thin layer on said object to be coated, a coating layer made up of one single color layer, single color laminated layers, or laminated layers of two colors are formed firstly, and then one or a plurality of kinds of slurries of other color(s) are applied sequentially, each of the layers being a thin layer having an average thickness between 3 and 15 micrometers;
then in said third step, temporary drying for curing the binder of said slurries is performed every time one layer or a plurality of layers are applied; and
after repeating the processing of said first to third steps, said binder is dried and cured finally in said fourth step.

12. A method for manufacturing an LED according to claim 10, characterized in that said drying device and said heated table are connected, an object to be coated on the heated table on which the slurry/slurries has/have been applied in the coating booth is transferred to the drying device by opening an open/close plate provided between the drying device and the coating booth, while being kept heated, whereby time taken to promote curing is shortened.

13. A method for manufacturing an LED according to claim 10, characterized in that:
said substrate LED is a ceramic substrate LED or a wafer level LED, and said slurry contains a silicone, or a silicone and a yellow phosphor;
said second step comprises a setting step of setting a mask with which only a portion that needs to be coated is exposed on said ceramic substrate LED or wafer level LED for application of a thin coating of said slurry made of a silicone or a silicone and a yellow phosphor, a dispersion liquid preparation step of preparing a dispersion liquid containing a phosphor and a solvent or of particulates of encapsulated phosphor and binder and a solvent, a dispersion liquid application step of selecting a dispersion liquid containing a red or green phosphor and applying it to form one or plurality of coating layers, a mask detaching step of detaching the mask to allow recovery of nonvolatile components of the dispersion liquid, and a lamination process of applying a slurry in another applicator to said coating layer of said object to be coated from which said mask has been detached immediately or after promoting curing of said silicone by a drying device to form a laminated layer.

14. A method for manufacturing an LED according to claim 1, characterized in that:
in said first step, a combination of two kinds of phosphor slurries for laminated layers are selected from among a combination of red and green phosphor slurries, a combination of green and yellow phosphor slurries, and a combination of red and yellow phosphor slurries;
in said second step, when forming said at least one thin layer on said object to be coated, a coating layer made up of one single color layer, single color laminated layers, or laminated layers of two colors are formed firstly, and then one or a plurality of kinds of slurries of other color(s) are applied sequentially, each of the layers being a thin layer having an average thickness between 3 and 15 micrometers;
then in said third step, temporary drying for curing the binder of said slurries is performed every time one layer or a plurality of layers are applied; and
after repeating the processing of said first to third steps, said binder is dried and cured finally in said fourth step.

15. A method for manufacturing an LED according to claim 1, characterized in that said drying device and said heated table are connected, an object to be coated on the heated table on which the slurry/slurries has/have been applied in the coating booth is transferred to the drying device by opening an open/close plate provided between the drying device and the coating booth, while being kept heated, whereby time taken to promote curing is shortened.

16. A method for manufacturing an LED according to claim 1, characterized in that:
said substrate LED is a ceramic substrate LED or a wafer level LED, and said slurry contains a silicone, or a silicone and a yellow phosphor;
said second step comprises a setting step of setting a mask with which only a portion that needs to be coated is exposed on said ceramic substrate LED or wafer level LED for application of a thin coating of said slurry made of a silicone or a silicone and a yellow phosphor, a dispersion liquid preparation step of preparing a dispersion liquid containing a phosphor and a solvent or of particulates of encapsulated phosphor and binder and a solvent, a dispersion liquid application step of selecting a dispersion liquid containing a red or green phosphor and applying it to form one or plurality of coating layers, a mask detaching step of detaching the mask to allow recovery of nonvolatile components of the dispersion liquid, and a lamination process of applying a slurry in another applicator to said coating layer of said object to be coated from which said mask has been detached immediately or after promoting curing of said silicone by a drying device to form a laminated layer.

17. An LED produced by forming laminated layers of phosphors of at least two colors selected from red, green, and yellow on a substrate LED, the LED being produced by: preparing slurries containing respective phosphors, a binder, and a solvent, colors of which are selected from combinations of at least red and green, at least green and yellow, at least red and yellow, the proportion of the phosphor being larger than the binder in weight ratio in the slurry of at least one color, the viscosity of the slurries being in the range of 1 to 100 mPa·s; applying a slurry of at least one color to the substrate LED placed on a table heated to a temperature in the range of 30° C. to 90° C., by spraying while applying impact to the slurry with pulse to vaporize the solvent instantaneously, thereby forming at least one thin coating layer; promoting curing of the binder using a drying device; and forming a laminated layer by applying a slurry of at least one other color among the at least two colors and drying and curing it, the average layer thickness of the slurry of one color being in the range between 3 and 15 micrometers.

18. A method for manufacturing an LED component, which is a phosphor plate used to directly cover a substrate LED or a remote phosphor film for an LED, characterized by comprising:
- preparing slurries of different colors containing phosphors, which are selected from red, yellow, and green phosphors to include at least red and yellow phosphors or green and yellow phosphors, a binder, and a solvent, a weight ratio of the phosphors and the binder in the slurries being in the range between 1:3 and 10:1, the weight ratio of nonvolatile components and the solvent in the slurries being in the range between 4:1 and 1:4, and the viscosity of the slurries being in the range between 1 and 100 mPa·s; and
- applying slurries to a plastic film or other substrate heated to a temperature in the range of 30° C. to 90° C. using applicators while vaporizing the solvent instantaneously to form thin laminated layers, and drying and curing the layers so that the average thickness of at least one slurry layer falls in the range between 3 and 15 micrometers in equivalent weight per unit area.

19. A method for manufacturing an LED component according to claim 18, characterized in that the binder is a silicone, said applicators are atomizing applicators that atomize the slurries into particles and apply slurries to said plastic film or substrate while charging the particles with electricity to prevent aggregation of atomized particles to form laminated layers.

* * * * *